(12) United States Patent
Buter et al.

(10) Patent No.: US 8,390,372 B2
(45) Date of Patent: Mar. 5, 2013

(54) SAMPLE-AND-HOLD AMPLIFIER

(75) Inventors: Berry Anthony Johannus Buter, Veldhoven (NL); Hans Van de Vel, Geel (BE)

(73) Assignee: NXP, B.V., Eindhoven (NL)

( * ) Notice: Subject to any disclaimer, the term of this patent is extended or adjusted under 35 U.S.C. 154(b) by 42 days.

(21) Appl. No.: 13/050,541

(22) Filed: Mar. 17, 2011

(65) Prior Publication Data

US 2012/0068766 A1    Mar. 22, 2012

(30) Foreign Application Priority Data

Mar. 19, 2010  (EP) ..................................... 10250528

(51) Int. Cl.
*H03F 1/02* (2006.01)
(52) U.S. Cl. ............................................. 330/9
(58) Field of Classification Search .............. 330/9, 107, 330/292; 327/124
See application file for complete search history.

(56) References Cited

U.S. PATENT DOCUMENTS

| | | | |
|---|---|---|---|
| 5,410,270 A * | 4/1995 | Rybicki et al. ..................... | 330/9 |
| 5,914,638 A | 6/1999 | He | |
| 6,577,185 B1 * | 6/2003 | Chandler et al. ................... | 330/9 |
| 7,663,516 B1 * | 2/2010 | Chandra ........................ | 341/120 |
| 2007/0001757 A1 | 1/2007 | Josefsson | |

FOREIGN PATENT DOCUMENTS

WO    02/07306 A1    1/2002

OTHER PUBLICATIONS

Hsu, C. -C. et al., "A CMOS 33-mW 100-MHz 80-dB SFDR Sample-and-Hold Amplifier", VLSI Circuits Symp. Dig., pp. 263-266 (2003).
Lee, Z-M., et al. "A CMOS 15-bit 125-MS/s Time-Interleaved ADC With Digital Background Calibration", IEEE J. of Solid-State Circuits, vol. 42, No. 10, pp. 2149-2160 (Oct. 2007).
Gregoire, B. et al. "An Over-60 dB True Rail-to-Rail Performance Using Correlated Level Shifting and an Opamp With Only 30 dB Loop Gain", IEEE J. of Solid-State Circuits, vol. 43, No. 12, pp. 2620-2630 (Dec. 2008).
Extended European Search Report for EP Patent Appln. No. 10250528.6 (Sep. 1, 2010).

* cited by examiner

*Primary Examiner* — Steven J Mottola

(57) ABSTRACT

A sample-and-hold amplifier (400) having a sample phase of operation and a hold phase of operation. The sample-and-hold amplifier comprising one or more sampling components (404, 406) configured to sample input signals during the sample phase of operation, and provide sampled input signals during the hold phase of operation, and an amplifier (402) configured to pre-charge the output (416, 418) of the sample-and-hold amplifier (400) during the sample phase of operation, and buffer the sampled input signal during the hold phase of operation.

20 Claims, 11 Drawing Sheets

SAMPLE-AND-HOLD AMPLIFIER

CROSS-REFERENCE TO RELATED APPLICATIONS

This application claims the priority under 35 U.S.C. §119 of European patent application no. 10250528.6, filed on Mar. 19, 2010, the contents of which are incorporated by reference herein.

The present disclosure relates to the field of sample-and-hold amplifiers, and particularly, although not exclusively, sample-and-hold amplifiers having a hold phase of operation and a sample phase of operation that can be used with time-interleaved analogue to digital converters.

There is a trend towards ever higher sample-rates for high-resolution analogue to digital converters (ADCs). Time interleaving is a common technique to increase the sample rate, although time interleaving of the front-end sample-and-hold amplifier (SHA) may not be practical for high-resolution ADCs due to stringent timing alignment requirements. "A CMOS 33-mW 100-MHz 80-dB SFDR Sample-and-Hold Amplifier" by C-C Hsu and Wu J-T (VLSI Circuits Symp. Dig., pages 263-264, 2003) discloses a high-speed high-resolution sample-and-hold amplifier (SHA).

"A CMOS 15-bit 125-MS/s Time-Interleaved ADC With Digital Background Calibration" by Z-M Lee, C-Y Wang, and J-T Wu. (IEEE Journal of Solid-State Circuits, 42:2149-2160, 2007) discloses a two-channel time-interleaved pipelined ADC.

"An Over-60 dB True Rail-to-Rail Performance Using Correlated Level Shifting and an Opamp With Only 30 dB Loop Gain" by B. R. Gregoire and U.-K. Moon (IEEE Journal of Solid-State Circuits, 43:2620-2630, 2008) discloses correlated level shifting (CLS).

The listing or discussion of a prior-published document or any background in the specification should not necessarily be taken as an acknowledgement that the document or background is part of the state of the art or is common general knowledge.

According to a first aspect of the invention, there is provided a sample-and-hold amplifier having a sample phase of operation and a hold phase of operation, the sample-and-hold amplifier comprising:
one or more sampling components configured to sample input signals during the sample phase of operation, and provide sampled input signals during the hold phase of operation; and
an amplifier configured to pre-charge the output of the sample-and-hold amplifier during the sample phase of operation, and buffer the sampled input signal during the hold phase of operation.

Utilising the amplifier to pre-charge the output, for example by setting the voltage at the output of the sample-and-hold amplifier at a level that is likely to be closer to the desired output level, can provide an efficient sample-and-hold amplifier. Prior art sample-and-hold amplifiers that use auxiliary/additional amplifiers/buffers to pre-charge the output can consume more power than embodiments of the invention.

The one or more sampling components may be one or more capacitors that are configured to be charged by the input signals during the sample phase of operation, and connected across the amplifier during the hold phase of operation to provide the buffered/sampled input signals.

The amplifier may be configured to pre-charge the output of the sample-and-hold amplifier by coupling the input signals of the sample-and-hold amplifier to the inputs of the amplifier, and coupling the inputs of the amplifier to the outputs of the sample-and-hold amplifier. In this way, the instantaneous value at the input to the sample-and-hold amplifier can be passed to the output of the sample-and-hold amplifier whilst the input is being sampled, and this instantaneous value can be closer to the desired output level than the level that was recorded during the previous sampling operation.

The sample-and-hold amplifier may comprise a plurality of switches that are switchable in order to set the phase of operation of the sample-and-hold amplifier. It will be appreciated that numerous different configurations of switches can be provided that enable the sample-and-hold amplifier to operate as disclosed herein.

The sample-and-hold amplifier may further comprise a feedback network between the inputs of the amplifier, the outputs of the amplifier, and the inputs of the sample-and-hold amplifier. Through operation of associated switches, the feedback network and the amplifier can provide a unity gain amplifier/buffer between the inputs and outputs of the sample-and-hold amplifier during the sample phase of operation.

The feedback network can comprise passive components, and in some embodiments only passive components. The passive components can be resistors and/or capacitors and/or switches and/or coils/inductors, and may not include active components such as amplifiers that consume power.

The amplifier may be an operational transconductance amplifier or an operational amplifier.

The amplifier may be a Miller amplifier having a first sub-stage and a second sub-stage. The amplifier may also comprise a first Miller capacitance associated with a first (negative) output of the Miller amplifier, and a second Miller capacitance associated with a second (positive) output of the Miller amplifier. The second sub-stage may be disconnected/decoupled/bypassed during the hold phase of operation.

The Miller capacitances may be configured such that the output of the sample-and-hold amplifier during the sample phase of operation is pre-charged as well as the Miller capacitances themselves. The Miller capacitances can then be used as level shift capacitors during the hold phase of operation of the sample-and-hold amplifier (SHA) to implement correlated level shifting (CLS) without requiring any additional components.

The first and second sub-stages may be used in series during the sample mode of operation.

The feedback factor of the amplifier may be 0.5 during the sample phase of operation. The feedback factor of the amplifier may be 1 during the hold phase of operation.

According to a further aspect of the invention, there is provided a method of operating a sample-and-hold amplifier, the sample-and-hold amplifier comprising an amplifier, the method comprising:
sampling input signals during a sample phase of operation;
providing sampled input signals during a hold phase of operation; and using the amplifier to:
pre-charge the output of the sample-and-hold amplifier during the sample phase of operation; and
buffer the sampled input signal during the hold phase of operation.

According to a further aspect of the invention, there is provided an analogue to digital converter comprising any sample-and-hold amplifier disclosed herein.

According to a further aspect of the invention, there is provided an integrated circuit comprising any sample-and-hold amplifier disclosed herein, or any analogue to digital converter disclosed herein.

According to a further aspect of the invention, there is provided a computer program, which when run on a computer, causes the computer to configure any apparatus, including a sample-and-hold amplifier, analogue to digital converter, circuit, system, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium such as a disc or a memory device, or may be embodied as a transient signal. Such a transient signal may be a network download, including an internet download.

A description is now given, by way of example only, with reference to the accompanying drawings, in which.

One or more embodiments described herein relate to a sample-and-hold amplifier that operates according to a sample phase of operation and a hold phase of operation. The sample-and-hold amplifier includes an amplifier (such as an operational transconductance amplifier (OTA)) which can be used to buffer an input signal during the hold phase of operation in a conventional way, and can also be used to "pre-charge" the output of the sample-and-hold amplifier during the sample phase of operation. Such embodiments can avoid the requirement for additional buffers to pre-charge the output during the sample phase of operation by utilising the OTA that would otherwise not be used during the sample phase of operation. This can lead to a more efficient sample-and-hold amplifier, as fewer components may be required and/or power consumption of the sample-and-hold amplifier can be reduced.

In some embodiments, a Miller topology amplifier can be used as part of the sample-and-hold amplifier, and the amplifier can be used to pre-charge the output during the sample phase and the Miller capacitance can be used to implement correlated level shifting (CLS) in the hold phase.

Figure 1:
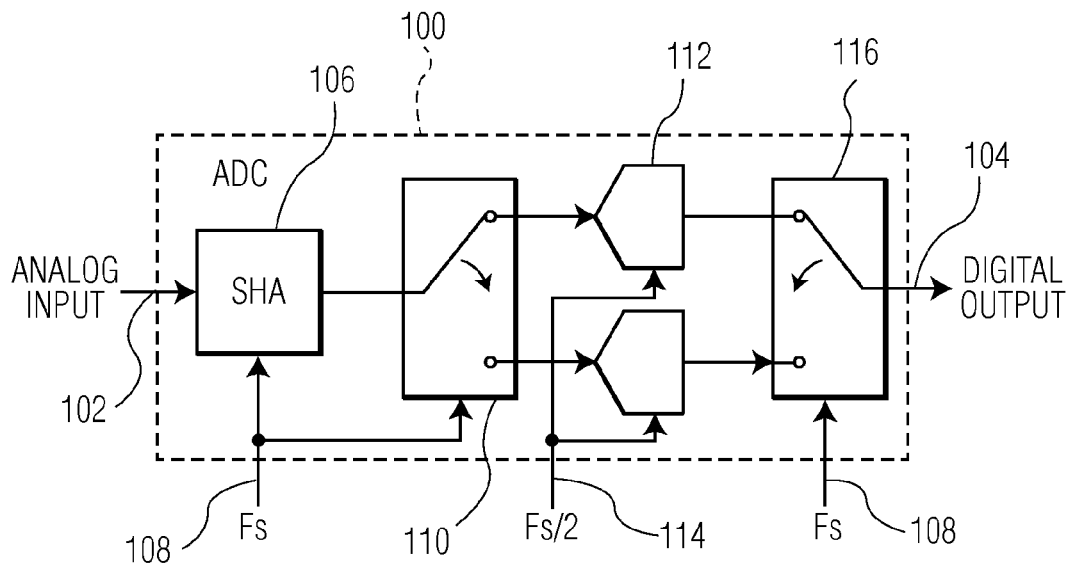
FIG. 1 illustrates the architecture of a time-interleaved ADC.

FIG. 1 illustrates the architecture of a time-interleaved analogue to digital converter (ADC) 100. In this example, the ADC 100 consists of two back-end ADC slices 112.

The ADC 100 receives an analogue input signal 102 which is provided to a sample-and-hold amplifier (SHA) 106. The SHA 106 is operated according to a required sampling frequency $F_s$ 108, and the output of the SHA 106 is coupled to one of the interleaved ADC slices 112 by a switching component 110. The switching component 110 is also operated according to the switching frequency $F_s$ 108. By providing a plurality of interleaved ADC slices 112, the ADC slices 112 can operate at a frequency that is less than the required sampling frequency, and in this example the ADC slices 112 operate at $F_s/2$ 114. The outputs of the ADC slices 112 are then multiplexed by switching component 116, operating at the sampling frequency $F_s$ 108, to provide the digital output signal 104.

It will be appreciated that although the frequency of operation of the ADC slices 112 has been reduced, the SHA 106 still has to operate at the full sample rate $F_s$ 108. Therefore, the speed of the SHA 106 can limit the overall ADC speed.

Figure 2:
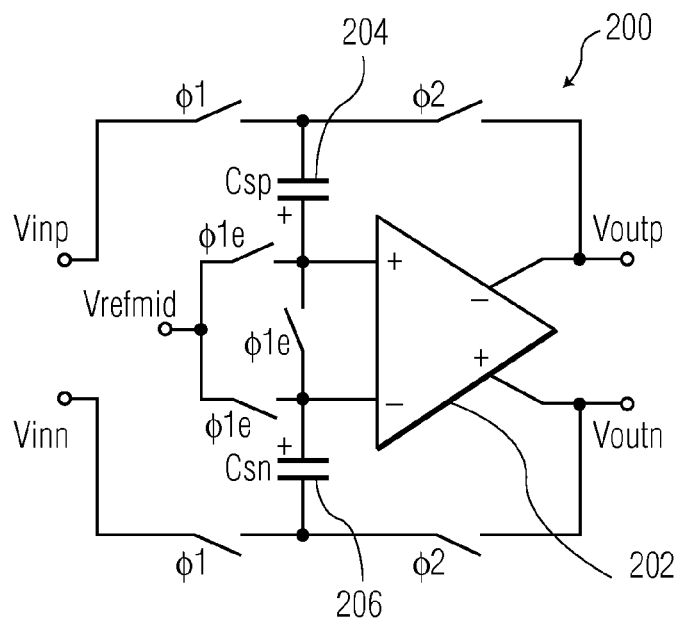
FIG. 2 illustrates a prior art sample and hold amplifier.

FIG. 2 illustrates schematically an example of a prior art sample-and-hold amplifier (SHA) 200. The SHA 200 includes an operational transconductance amplifier (OTA) 202, a first sampling capacitor $C_{sp}$ 204 that is used to sample the positive input to the SHA 200, and a second sampling capacitor $C_{sn}$ 206 that is used to sample the negative input voltage. The SHA 200 can operate according to a first and second phase of operation according to the state of a number of switches in the SHA 200 that are operated by clock signals φ1 and φ2. Further details of the operation of such an SHA 200 will be appreciated from the following description of FIGS. 3a to 3c that illustrate a similar prior art example.

As is known in the art, the demands on the OTA 202 can be relaxed by pre-charging the output with auxiliary buffers, and such an example will be described with reference to FIGS. 3a to 3c.

Figure 3A:
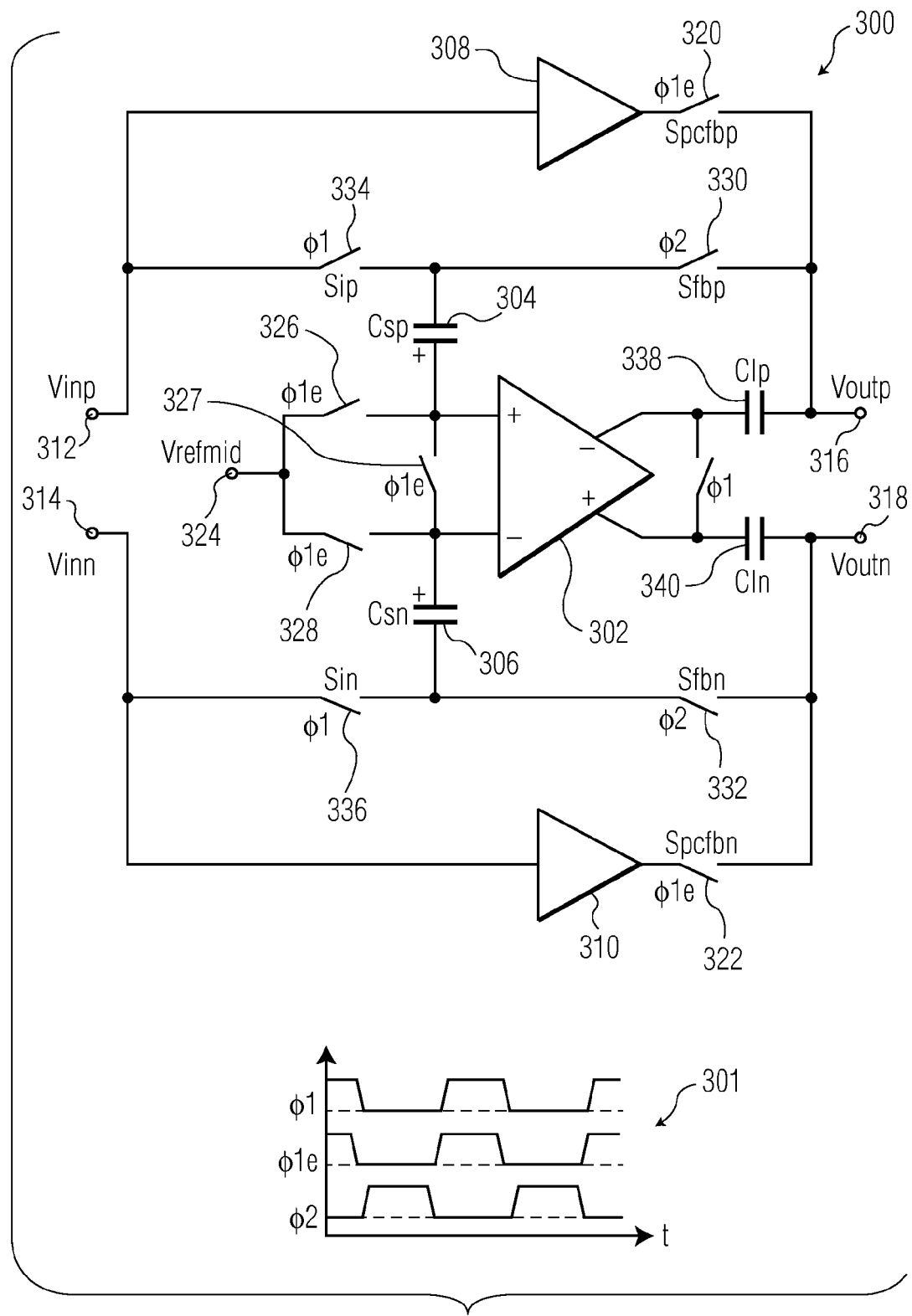
FIGS. 3a to 3c illustrate a prior art buffered pre-charge sample-and-hold amplifier.

FIG. 3a illustrates a buffered pre-charge sample-and-hold amplifier (SHA) 300 and a corresponding timing diagram 301 showing the inter-relation of the different phases of operation. Each switch in FIG. 3a is shown associated with the clock (φ1, φ1e, φ2) with which it is operated, and the state of the switches defines the phase of operation. FIG. 3b illustrates the SHA 300 of FIG. 3a in a sample phase of operation, that is when φ1 and φ1e are high (and the associated switches are closed), and φ2 is low (and the associated switches are open). FIG. 3c illustrates the SHA 300 of FIG. 3a in a hold phase of operation, that is when φ2 is high, and φ1 and φ1e are low.

It can be seen that the SHA 300 of FIG. 3 includes two auxiliary/additional amplifiers 308, 310 that can be directly connected between the inputs 312, 314 of the SHA 300 and the outputs 316, 318 of the SHA 300. The additional amplifiers 308, 310 can be operably connected and disconnected between the inputs 312, 314 and the outputs 316, 318 in accordance with the state of switches 320, 322. As will be described below, this can enable the outputs 316, 318 of the SHA to be "pre-charged" with an approximate value for the desired output level whilst the SHA 300 is more accurately sampling the signal level at the input 312, 314.

Figure 3B:
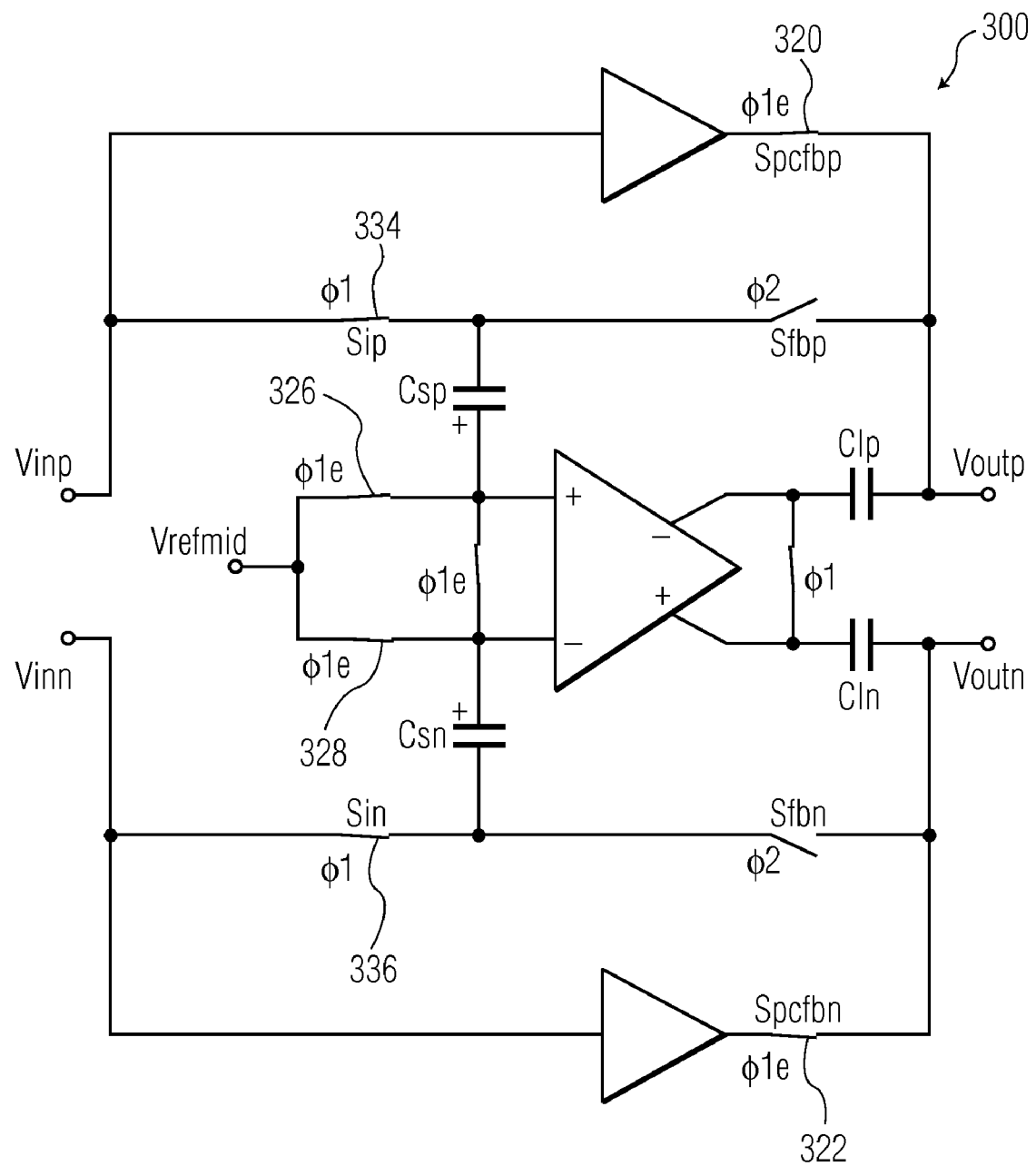
Figure 3C:
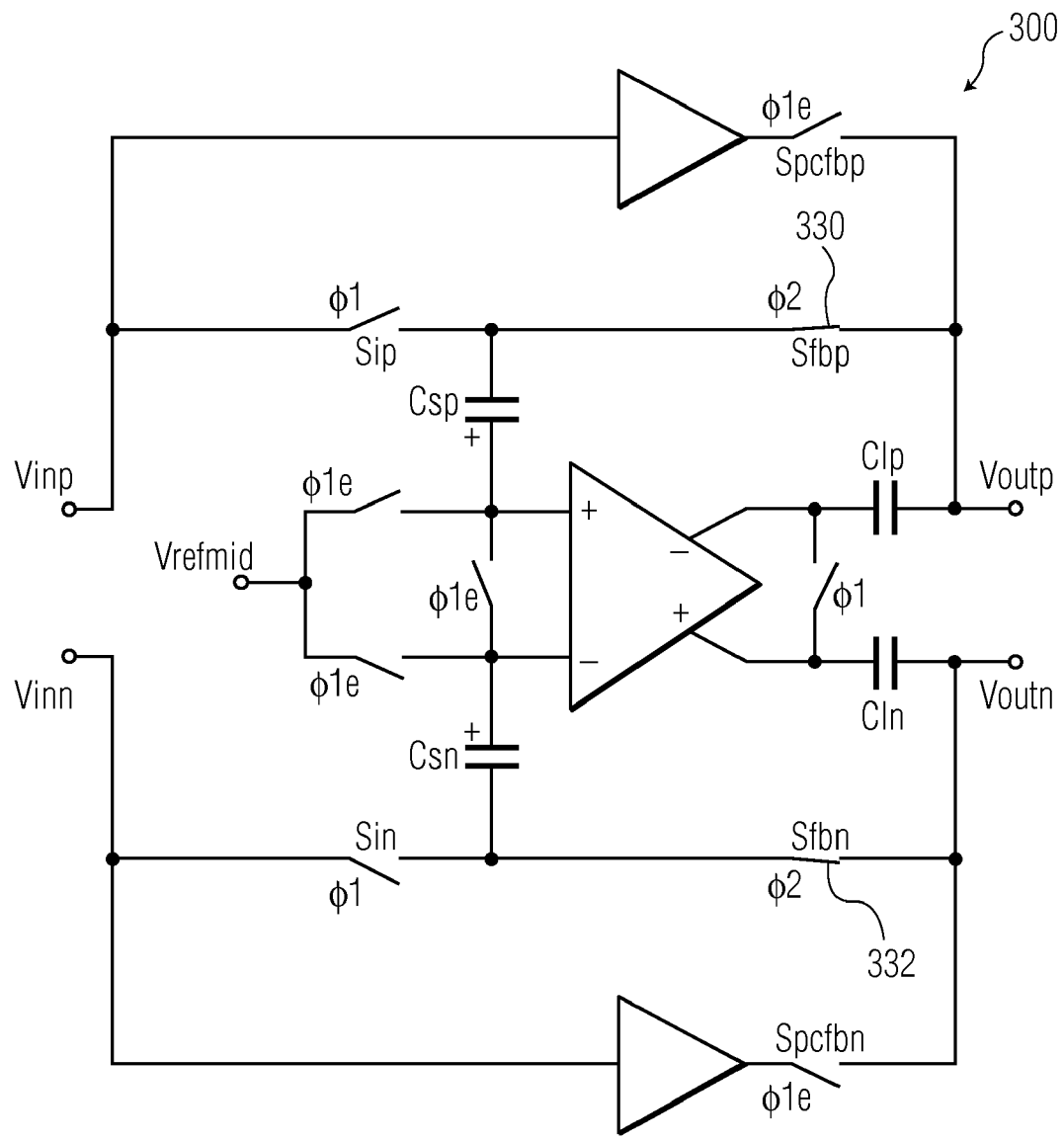

A more detailed description of the operation of the SHA 300 with relation to FIGS. 3a to 3c will now follow.

FIG. 3a includes a timing diagram 301 that illustrates the sample-and-hold phase of operation of the SHA 300. The SHA 300 is operating in a sample mode of operation when the clock signal φ1 is high and the clock signal φ2 is low. A third clock signal, φ1e, generally corresponds to the clock signal φ1, although is configured such that it transitions from a high value to a low value shortly before the φ1 clock signal transitions from a high value to a low value.

The third clock signal, φ1e, is applied to the following switches:
switch 326 between the reference input voltage 324 and the positive input of the OTA 302;
switch 328 between the reference input voltage 324 and the negative input of the OTA 302; and
switch 327 between the negative input of the OTA 302 and the positive input of the OTA 302.

It will be appreciated that switch 327 is optional in some embodiments, as the SHA may be able to function without switch 327.

With these switches (326, 327, 328) there is only a small voltage swing at the terminals of the switches (326, 327, 328), which is in contrast to the voltage swing at the terminals of switches 334 and 336, which are connected to the positive and negative input voltages 312, 314. It is known that turning off a switch injects a charge onto the associated sample capacitors $C_{sp}$ (304), $C_{sn}$ (306). For the switches 326, 327, 328 that experience a small voltage swing, this induced charge is signal independent to first order. Therefore, it can be advantageous in some embodiments in terms of linearity for these switches to be opened before the switches 334, 336 that experience a larger voltage swing, in order to prevent charge from being injected from the switches 334, 336 that would otherwise impact the charge on the sample capacitors $C_{sp}$ (304), $C_{sn}$ (306). This method of operation is well known and is called "bottom-plate sampling".

FIG. 3b illustrates the SHA 300 of FIG. 3a in the sample phase of operation, with the switches that are associated with the clock signals φ1 and φ1e closed, and the switches that are associated with the clock signal φ2 open. FIG. 3c illustrates the SHA 300 of FIG. 3a in the hold phase of operation, with the switches associated with the clock signal φ2 closed, and the switches associated with the clock signals φ1 and φ1e open.

The SHA 300 receives a positive input voltage 312, a negative input voltage 314 and a reference input voltage 324. In some examples, the reference input voltage 324 may be ground.

When the clock signal φ1e goes high, and the SHA 300 enters the sample mode of operation, the two switches 326, 328 between the reference input voltage 324 and the positive plates of the sampling capacitors 304, 306 are closed, and the switches 334, 336 located between the inputs 312, 314 and the negative plates of the sampling capacitors 304, 306 are also closed. In this way, a closed circuit is provided such that the instantaneous input signals received at the positive and negative inputs 312, 314 are sampled across the sample capacitors 304, 306.

Also during the sample phase of operation, as illustrated in FIG. 3b, the additional amplifiers 308, 310 are directly coupled between the respective inputs 312, 314 and outputs 316, 318 of the SHA 300 as the switches 320, 322 are closed. In this way, the signal levels at the outputs of the OTA 302 are pre-charged to an approximate level of the intended output.

In the hold phase of operation, as shown in FIG. 3c, the switches 330, 332 between the negative plates of the sampling capacitors 304, 306 and the outputs 316, 318 are closed such that the sampling capacitors 304, 306 together with the OTA 302 form a unity gain buffer that buffers the sampled input signals.

As the outputs of the OTA 302 have been pre-charged/preset to approximate output levels during the sample phase, when the OTA 302 is changed to the hold phase of operation, the output of the OTA 302 only needs to be adjusted by a pre-charge error instead of the difference between the value on the sample capacitor and the previous output signal of the OTA 302 that is still stored on the load capacitance. That is, the amount that the output signal of the OTA 302 has to change when entering a hold mode of operation can be reduced. The load capacitance is the sum of the OTA 302 output capacitance, sample capacitance of an ADC slice with which the SHA 300 is associated, and any parasitic capacitances.

The additional buffers 308, 310 can be used to minimise the loading at the input of the SHA 300 such that a high input bandwidth can be realised. The additional amplifiers/buffers 308, 310 should fulfil requirements of slew-rate and bandwidth to pre-charge the SHA output to the required accuracy. Non-linearity of the additional amplifiers 308, 310 may impact the magnitude of the pre-charge error.

The capacitors $C_{lp}$ 338 and $C_{ln}$ 340 shown in FIG. 3 are optional, and are connected between the outputs of the OTA 302 and the outputs 316, 318 of the SHA 300. Such capacitors can implement a technique known as correlated level shifting (CLS) such that during the sample phase of operation as illustrated in FIG. 3b, the level-shift capacitors 338, 340 are also pre-charged such that the output swing of the OTA 302 when entering the hold phase of operation can be reduced.

Incorporation of the optional capacitors 338, 340 can introduce an additional linearity requirement for the additional amplifiers 308, 310. Also, the optional capacitors 338, 340 that are required to implement CLS are an additional load for the additional amplifiers 308, 310.

The requirement for linearity of the additional amplifiers 308, 310 is approximately equal to the SHA linearity requirement reduced by the open loop OTA 302 gain. Therefore, a simple open-loop source-follower buffer, or a single stage OTA with unity feedback, may be used. For correct operation, without severe distortion, the input transistor(s) of the additional buffers 308, 310 should be kept in saturation, which sets a limit to the signal swing which can be realised for a given supply voltage.

For noise-limited ADC's, a large input signal swing is beneficial to realise an energy efficient converter. In order to be able to handle a large input signal swing, the amplifiers 308, 310 of FIG. 3a will consume a large amount of power, and therefore will reduce the efficiency of the SHA. The input transistor(s) in the buffers also need to be kept in saturation to prevent severe distortion, and when a simple open-loop source-follower buffer, or single stage OTA, is used as an additional amplifier this requirement can limit the SHA and thus the ADC input signal swing.

A feedback network can be provided across an OTA used as an auxiliary buffer in order to realise a unity gain closed loop transfer function, and in this way the voltage swing across the input transistors can be reduced. The voltage at the input transistors is equal to the OTA output voltage swing divided by the open loop gain of the OTA. A single stage OTA may not be able to achieve the required gain, and therefore a two-stage OTA may be required in order to reduce the swing at the input transistors, and this can consume more power still.

One or more embodiments described herein can relate to an SHA architecture whereby the main OTA itself is used as a buffer/amplifier with a feedback network to pre-charge the output during a sample phase of operation. In the prior art, the main OTA (302 in FIG. 3a) is not normally used during the sample phase of operation, although it will still consume power. Therefore, it has been identified that it is possible to reuse the main OTA during the sample phase of operation in order to reduce the overall SHA power consumption. Reusing the main OTA to pre-charge the SHA output renders an auxiliary/additional buffer/amplifier redundant. Furthermore, using a feedback network across the OTA to realise a unity gain buffer can ensure that the signal swing handling capabilities of the SHA is not limited.

Figure 4A:
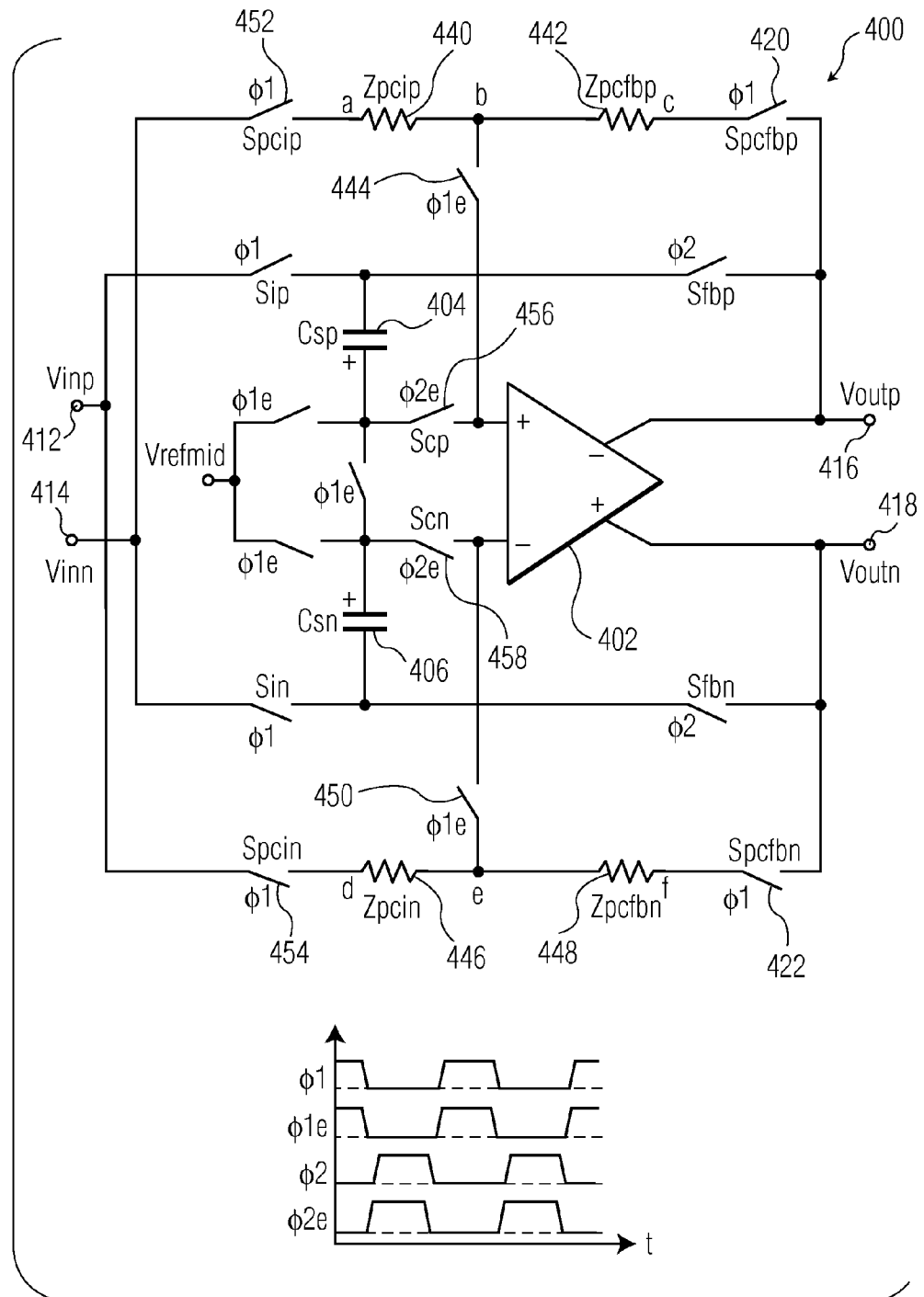
FIGS. 4a to 4c illustrate a sample-and-hold amplifier according to an embodiment of the invention.
Figure 4B:
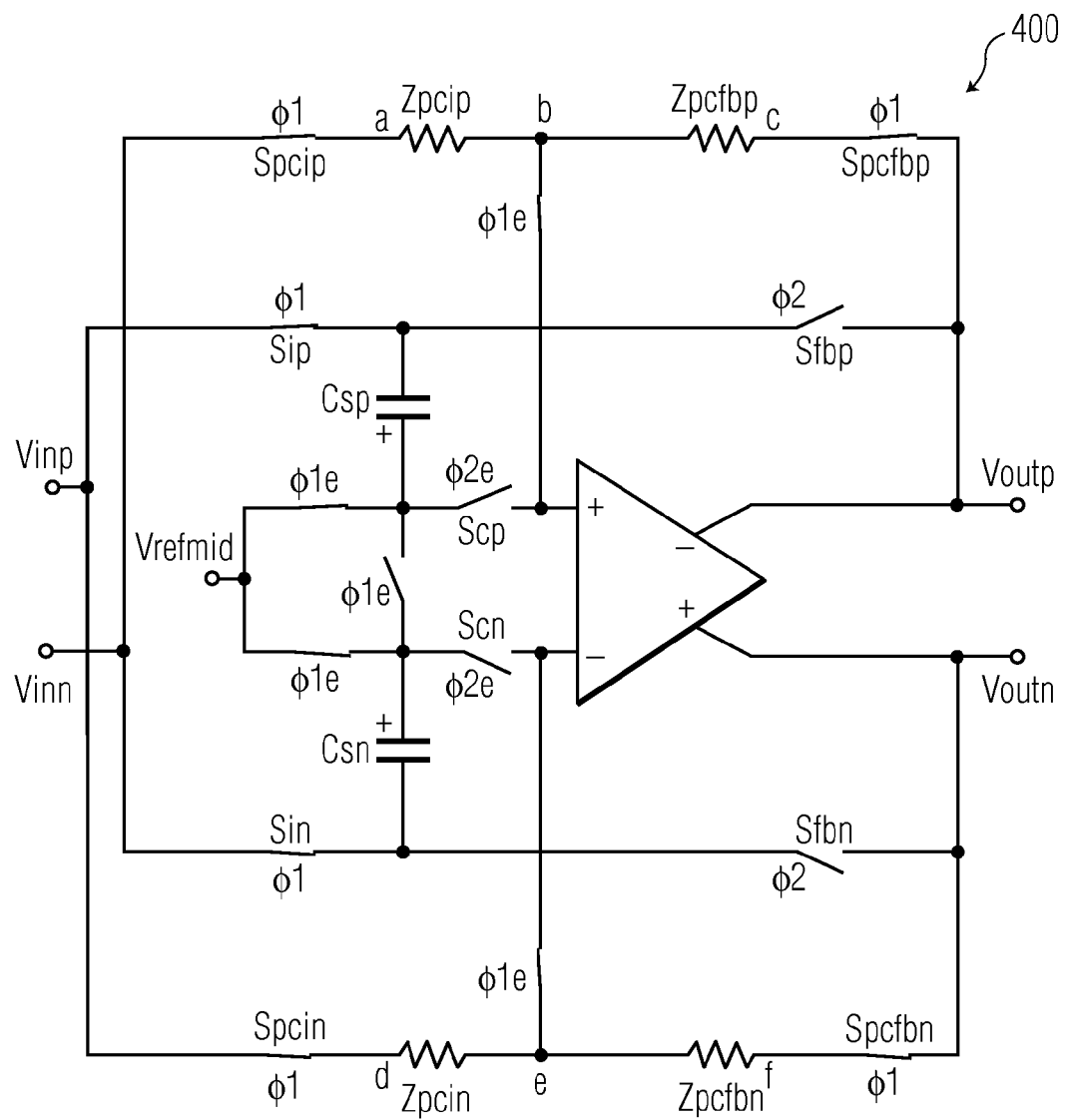
Figure 4C:
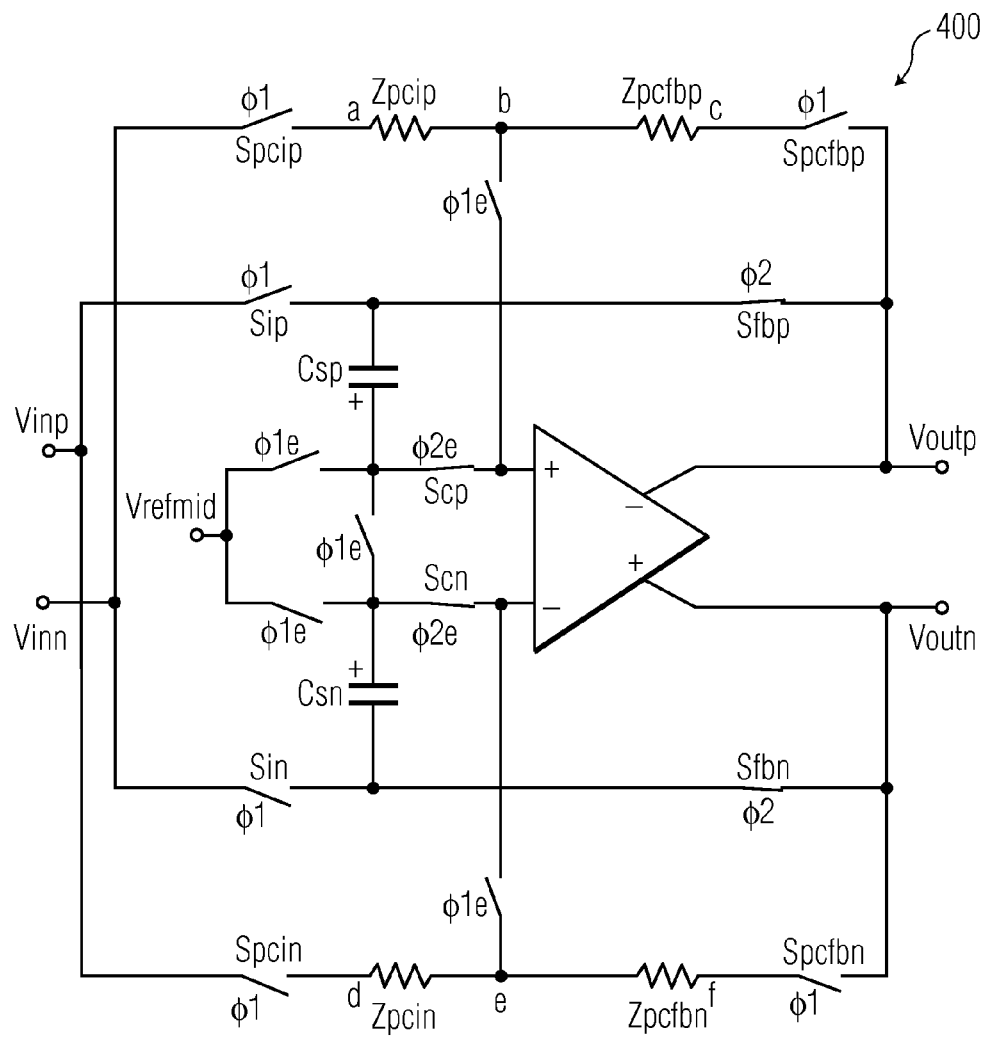

An example of a self-buffered pre-charge SHA is illustrated in FIGS. 4a to 4c. FIG. 4b illustrates the SHA 400 of FIG. 4a with the switches arranged according to the sample phase of operation, and FIG. 4c shows the SHA 400 with the switches arranged according to the hold phase of operation. Those components of FIGS. 4a to 4c that have already been described and illustrated with reference to FIGS. 3a to 3c will not necessarily be described again here.

During the sample phase of operation as illustrated in FIG. 4b, the clock signal φ1 is high, and the OTA 402 is in a unity gain configuration such that the output tracks the input. The OTA 402 may not be able to handle a large signal swing at its inputs, and therefore feedback networks are used to keep the levels at the inputs at virtual ground, and therefore there will only be a small voltage swing at the input due to the finite gain of the OTA 402. The feedback network consists of two branches, each with two impedances. The first feedback branch consists of $S_{pcip}$ switch 452, $Z_{pcip}$ impedance 440, switch 444, $Z_{pcfbp}$ impedance 442 and $S_{pcfbp}$ switch 420. The $S_{pcip}$, switch 452 is connected between the negative input pin 414 and a first terminal of the $Z_{pcip}$ impedance 440. The second terminal of the $Z_{pcip}$ impedance 440 is connected to a first terminal of the $Z_{pcfbb}$ impedance 442, and the second terminal of the $Z_{pcfbp}$ impedance 442 is connected to the positive output pin 416 by the $S_{pcfbp}$ switch 420. Another switch 444 is connected between the positive input of the OTA 402 and the junction between the $Z_{pcip}$ impedance 440 and the $Z_{pcfbp}$ 442 impedance. The switches 452 and 420 are operated in accordance with the φ1 clock signal, and the switch 444 is operated in accordance with the φ1e clock signal.

As can be seen in FIG. 4b, the second feedback branch comprises similar components and is similarly connected to the positive input pin 412, the negative output pin 418 and the negative input of the OTA 402.

In addition, further switches $S_{cp}$ 456 and $S_{cn}$ 458 are connected between the positive plates of the sampling capacitors 404, 406 and their respective inputs to the OTA 402 to decouple the signal on the inputs of the OTA 402 form the signal on the positive plates of the capacitors.

To have unity gain during the pre-charging/sample phase of operation, both impedances in each branch of the feedback network should have the same value. That is, $Z_{pcin}$ 446 should equal $Z_{pcfbn}$ 448, and $Z_{pcip}$ 440 should equal $Z_{pcfbp}$ 442.

Passive components (such as resistors and capacitors) can be used as the impedances 440, 442, 446, 448 as they do not consume power.

When resistors are used as the impedances, the input source would have to deliver a DC current, and the input signals to the SHA 400 would be reduced by the resistive voltage division of the feedback branches. Therefore, the impedance of these resistors should be large, for example several kilo ohms. The switches in the feedback branches ($S_{pcip}$ and $S_{pcfbp}$; and $S_{pcin}$ and $S_{pcfbn}$) cannot be used to realise the required impedance. The distortion introduced by these switches, which would also be seen at the input, would reduce the linearity of the signal on the sample capacitor. Also, large feedback resistor values, in combination with the input capacitance of the OTA 402, may lead to stability problems.

To improve the performance, capacitors can be used instead of resistors as the impedance components ($Z_{pcin}$, $Z_{pcfbn}$, $Z_{pcip}$, $Z_{pcfbp}$) in the feedback network. For proper operation, the initial conditions of each of the capacitors should be the same at the start of each sample/track phase of operation. To provide such equal initial conditions, the capacitors in the feedback network can be reset during the hold phase of operation. It will be appreciated by the skilled person that additional switches can be added to the SHA 400 of FIG. 4a in order to provide this functionality as is well known in the art. For example, including an additional switch across the capacitors, or including switches between nodes a, b and c and Vrefmid, and between nodes d, e and f and Vrefmid can provide the required initial conditions.

When the OTA 402 is used as a unity gain buffer during the track/sample phase of operation, the OTA 402 inverts the input signal. In the hold phase of operation however, the signal on the sample capacitors $C_{sp}$ and $C_{sn}$ is not inverted. To compensate for this, the input signal can be inverted during the track/sample phase of operation by interchanging the connection of the differential input signal. The input signal received at the positive input terminal $V_{inp}$ 412 is connected to node d of $Z_{pcin}$ 446 and input signal received at the negative input terminal $V_{inn}$ 414 is connected to node a of $Z_{pcip}$ 440 during the track/sample phase of operation.

During the track/sample phase of operation, the feedback factor of the OTA 402 is ideally 0.5, and during the hold phase of operation, the feedback factor of the OTA 402 is 1. To obtain the same closed-loop gain bandwidth (GBW) during the track/sample phase the OTA 402 GBW can be increased during this phase while maintaining stability.

Figure 6:
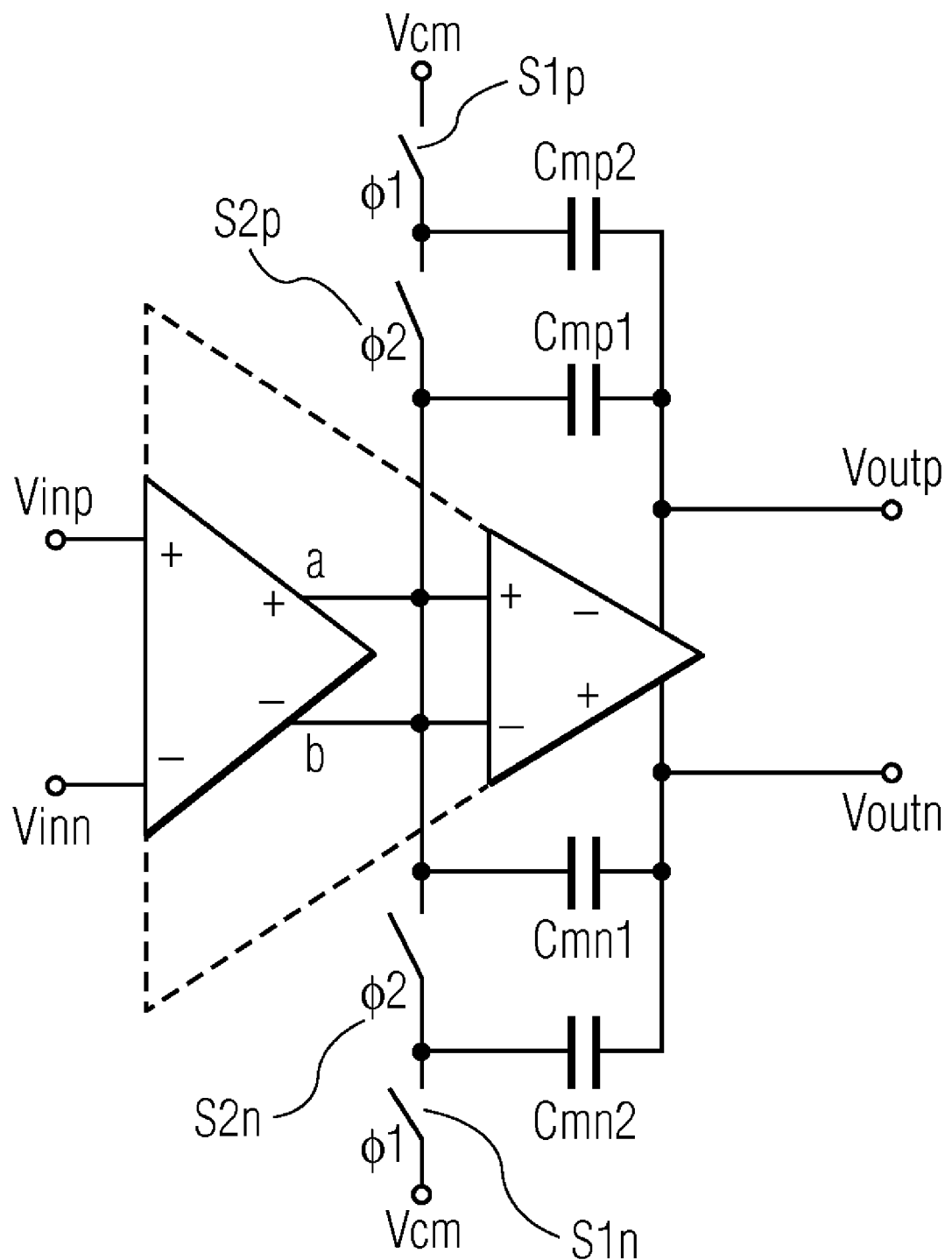
FIG. 6 illustrates an OTA that can be used with embodiments of the invention.

In examples where a Miller OTA 402 is used, then the gain-bandwidth (GBW) of the OTA can be made larger while maintaining stability during the track phase by dividing the Miller capacitor into two parts in parallel. An example of such an OTA is shown in FIG. 6. The Miller capacitor can then be made smaller during the track phase by switching off one part. The part of the Miller capacitor that is switched off may need to be pre-charged to ensure that the output is not influenced too much when switching to the hold phase of the SHA. During this pre-charging, the bottom plate of the Miller capacitor, which is connected to the output of the first amplifier stage of the OTA during the hold phase, should be connected to the common-mode output reference voltage of the first amplifier stage of the OTA.

In alternative embodiments, the first amplifier stage of the OTA can be split into two smaller stages connected in parallel. In such embodiments, both amplifier stages are used during the track phase to achieve a high transconductance (gm), and one amplifier stage is switched off during the hold phase to lower the transconductance (gm).

It will be appreciated that the circuits described above provide non-limiting examples of how the gain-bandwidth (GBW) of on OTA can be changed, and that alternative implementations may be known to those skilled in the art.

Figure 5A:
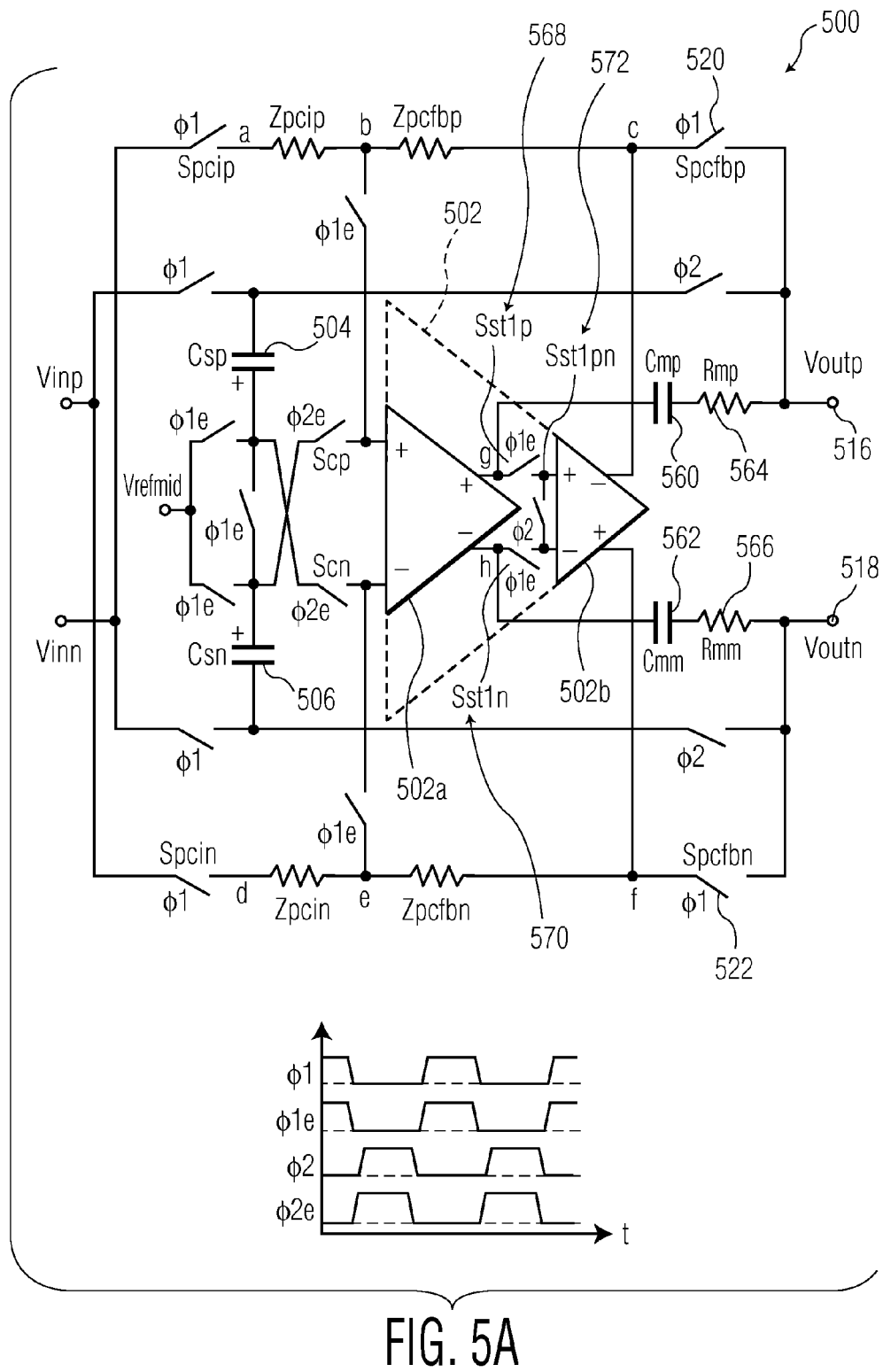
FIGS. 5a to 5c illustrate a sample-and-hold amplifier according to another embodiment of the invention.
Figure 5B:
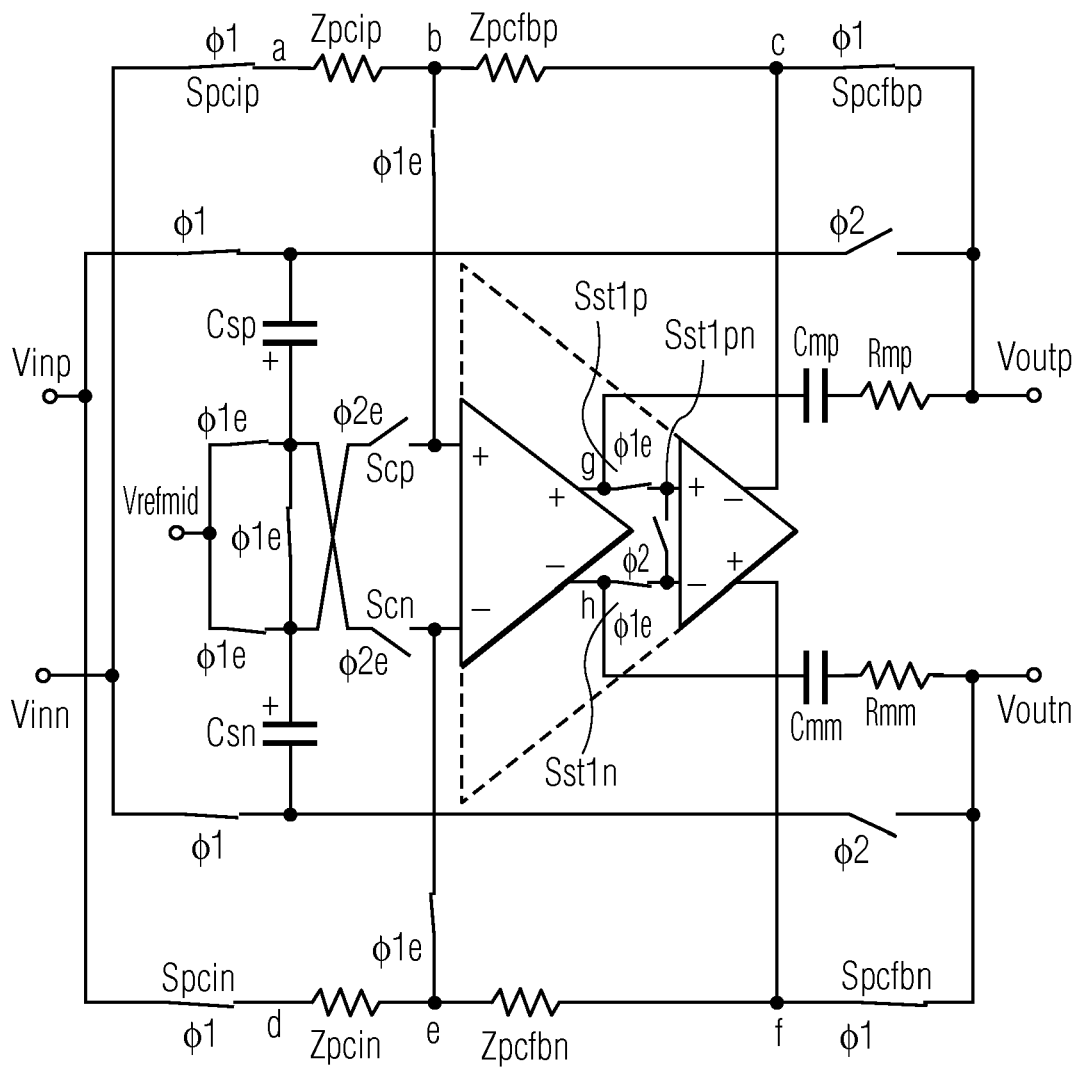
Figure 5C:
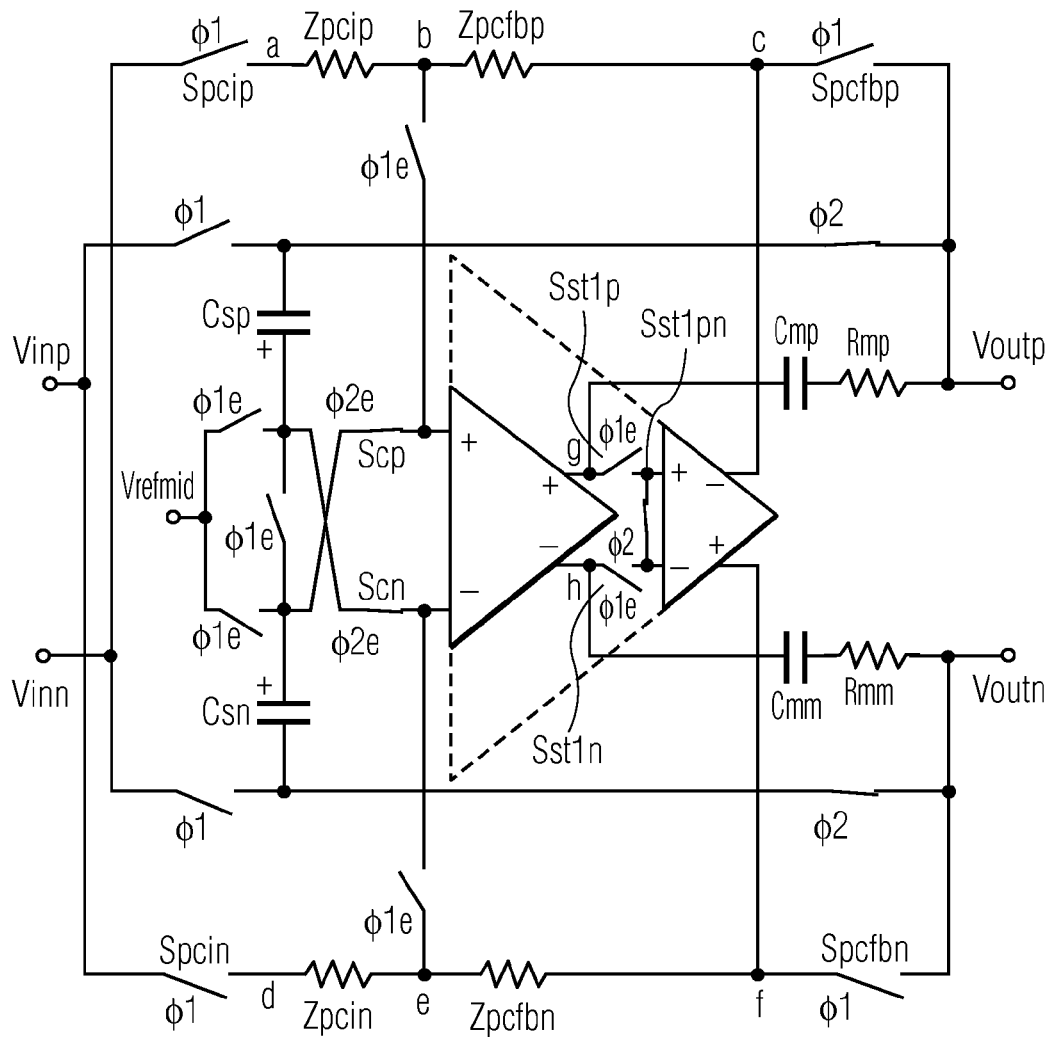

In examples where the main OTA is a two-stage Miller architecture, the associated Miller capacitance can be reused to implement correlated level shifting (CLS). The Miller capacitances can then be used as level shift capacitances during the hold phase. Such an embodiment is shown as FIGS. 5a to 5c. FIG. 5b shows the SHA 500 in the sample/track phase of operation, and FIG. 5c shows the SHA 500 in the hold phase of operation. Components that have been described with earlier embodiments will not be described again with reference to FIGS. 5a to 5c.

As shown in FIG. 5b, the OTA 502 is switched into a unity gain configuration and the output tracks the input during the track phase, when φ 1 is high.

The OTA 502 is configured as a normal two-stage Miller OTA 502, having a first sub-stage 502a, and a second sub-stage 502b. The Miller capacitance $C_{mp}$ 560 and optional compensation resistor $R_{mp}$ 564 are connected between the positive output of the first sub-stage 502a (node g) of the OTA 502 and the negative output pin of the second sub-stage 502b (node c) of the OTA 502 through switch $S_{pcfbp}$ 520. Correspondingly Miller capacitance $C_{mn}$ 562 and $R_{mn}$ 566 are connected between the negative output of the first sub-stage 502a (node h) of the OTA 502 and the positive output pin of the second sub-stage 502b (node f) of the OTA 502 through switch $S_{pcfbn}$ 522.

It will be appreciated that the Miller capacitances $C_{mp}$ 560 and $C_{mn}$ 562 and optional compensation resistors $R_{mp}$ 564 and $R_{mn}$ 566 are actually part of the Miller OTA 502, and are shown outside the OTA 502 in FIG. 5 for ease of illustration and understanding. It will also be appreciated that switches $S_{st1p}$ 568, $S_{st1n}$ 570 and $S_{st1pn}$ 572 are not part of a standard Miller OTA and can be required/used to obtain the desired operation.

The amplifier sub-stages 502a, 502b of the OTA 502 are connected to each other to operate like a two-stage Miller OTA 502 in the sample phase of operation. To compensate for the inversion of the input signal the differential input signals are cross-coupled. When the SHA 500 is in the sample phase of operation, and the clock signal 1e goes low, the instantaneous signals on the Miller capacitors $C_{mp}$ 560 and $C_{mn}$ 562 are sampled when the respective switches $S_{st1p}$ 568 and $S_{st1n}$ 570 are opened and both amplifier sub-stages 502a, 502b of the OTA 502 are disconnected from each other. Only the first amplifier sub-stage 502a of the OTA 502 is used during the hold phase. The second amplifier sub-stage 502b can still be active however, and to prevent/reduce any noise being coupled into the now floating input of the second sub-stage 502b, and therefore being amplified by the second sub-stage 502b, the inputs to the second sub-stage 502b can be short circuited by closing switch $S_{st1pn}$ 572.

As the second amplifier sub-stage 502b is decoupled during the hold phase of operation, the transfer from the OTA 502 input to the output of the SHA 500 becomes non-inverting. To have an overall negative feedback the positive plate of the sample capacitor $C_{sp}$ 504 is connected to the negative input of the OTA 502, and the positive plate of the sample capacitor $C_{sn}$ 506 is connected to the positive input of the OTA 502.

In the same way as described above, two equal impedances having the same values can be used for the feedback network.

An advantage of using a Miller topology to implement CLS is that there is no/reduced additional loading of the OTA during the pre-charge phase. Also, additional couple capacitors are not required. Another advantage is that during the hold phase, only the first stage of the OTA can be active (the second stage being effectively de-activated), and a single stage OTA can achieve a larger bandwidth than a two stage OTA.

One or more embodiments can relate to an integrated circuit (IC) comprising a sample-and-hold amplifier (SHA) as disclosed herein. The SHA may be part of an analogue-to-digital converter (ADC), which may be provided on an IC. Embodiments of the invention can be particularly advantageous as part of a 14 bit ADC with a sample rate that is greater than 250 mega samples per second.

The invention claimed is:

1. A sample-and-hold amplifier having a sample phase of operation and a hold phase of operation, the sample-and-hold amplifier comprising:
at least one sampling component configured to sample input signals during the sample phase of operation, and provide sampled input signals during the hold phase of operation; and
an amplifier having an output that is connected to an output of the sample-and-hold amplifier, wherein the amplifier is configured to:
provide an output signal to pre-charge the output of the sample-and-hold amplifier during the sample phase of operation, and
buffer the sampled input signal during the hold phase of operation,
wherein one of the at least one sampling component includes a first terminal and a second terminal, wherein the first terminal is connected to the amplifier through a first switch, and wherein the second terminal is connected to the output of the sample-and-hold amplifier through a second switch.

2. The sample-and-hold amplifier of claim 1, wherein the at least one sampling component is at least one capacitor that is configured to be charged by the input signals during the sample phase of operation, and connected across the amplifier during the hold phase of operation to provide the sampled input signals.

3. The sample-and-hold amplifier of claim 1, wherein the amplifier is configured to pre-charge the output of the sample-and-hold amplifier during the sample phase of operation by coupling the input signals of the sample-and-hold amplifier to the inputs of the amplifier, and coupling the inputs of the amplifier to the outputs of the sample-and-hold amplifier.

4. The sample-and-hold amplifier of claim 1, wherein the sample-and-hold amplifier comprises a plurality of switches that are switchable in an order to set the phase of operation of the sample-and-hold amplifier.

5. The sample-and-hold amplifier of claim 1, further comprising a feedback network between the inputs of the amplifier, the outputs of the amplifier, and the inputs of the sample-and-hold amplifier.

6. The sample-and-hold amplifier of claim 5, wherein the feedback network and the amplifier provide a unity gain amplifier between the inputs and outputs of the sample-and-hold amplifier during the sample phase of operation.

7. The sample-and-hold amplifier of claim 5, wherein the feedback network comprises passive components.

8. The sample-and-hold amplifier of claim 1, wherein the amplifier is one of an operational transconductance amplifier and an operational amplifier.

9. The sample-and-hold amplifier of claim 1, wherein the amplifier is a Miller amplifier having a first sub-stage and a second sub-stage, and first and second Miller capacitances, wherein the Miller capacitances are configured to allow the Miller amplifier to pre-charge the output of the sample-and-hold amplifier during the sample phase of operation, and also the Miller capacitances are configured to be pre-charged to the output voltage of the sample-and-hold amplifier during the sample phase of operation, and wherein the second sub-stage is configured to be disconnected during the hold phase of operation.

10. The sample-and-hold amplifier of claim 9, wherein the first and second Miller capacitances are configured to implement correlated level shifting during the hold phase of operation.

11. The sample-and-hold amplifier of claim 9, wherein the first and second sub-stages are configured in series during the sample mode of operation.

12. The sample-and-hold amplifier of claim 9, wherein the Miller capacitances are configured as level shift capacitors during the hold phase of operation.

13. An analogue to digital converter comprising the sample-and-hold amplifier according to claim 1.

14. A method of operating a sample-and-hold amplifier, the sample-and-hold amplifier comprising an amplifier having an output that is connected to an output of the sample-and-hold amplifier, the method comprising:
sampling input signals during a sample phase of operation;
providing sampled input signals during a hold phase of operation; and
using the amplifier to:
provide an output signal to pre-charge the output of the sample-and-hold amplifier during the sample phase of operation; and buffer the sampled input signal during the hold phase of operation, wherein the amplifier is a Miller amplifier having a first sub-stage and a second sub-stage, and first and second Miller capacitances, wherein the Miller capacitances allow the Miller amplifier to pre-charge the output of the sample-and-hold amplifier during the sample phase of operation, and wherein the method further comprises:

pre-charging the Miller capacitances to the output voltage of the sample-and-hold amplifier during the sample phase of operation; and disconnecting the second sub-stage during the hold phase of operation.

15. A computer program embodied in a non-transitory computer readable medium, which when run on a computer, causes the computer to perform the method of claim 14.

16. The sample-and-hold amplifier of claim 1, wherein the amplifier is configured to pass the input signals to the output of the sample-and-hold amplifier to pre-charge the output of the sample-and-hold amplifier during the sample phase of operation.

17. The sample-and-hold amplifier of claim 1, further comprising switches connected between the one or more sampling components and the inputs to the amplifier, wherein switches are configured to decouple the signal on the inputs of the amplifier from the one or more sampling components during the sample phase of operation.

18. A sample-and-hold amplifier having a sample phase of operation and a hold phase of operation, the sample-and-hold amplifier comprising:

at least one sampling component configured to sample input signals during the sample phase of operation, and provide sampled input signals during the hold phase of operation; and an amplifier having an output that is connected to an output of the sample-and-hold amplifier, wherein the amplifier is configured to:

provide an output signal to pre-charge the output of the sample-and-hold amplifier during the sample phase of operation, and buffer the sampled input signal during the hold phase of operation, wherein the amplifier is a Miller amplifier having a first sub-stage and a second sub-stage, and first and second Miller capacitances, wherein the Miller capacitances are configured to allow the Miller amplifier to pre-charge the output of the sample-and-hold amplifier during the sample phase of operation, and also the Miller capacitances are configured to be pre-charged to the output voltage of the sample-and-hold amplifier during the sample phase of operation, and wherein the second sub-stage is configured to be disconnected during the hold phase of operation.

19. The sample-and-hold amplifier of claim 18, wherein the at least one sampling component is at least one capacitor that is configured to be charged by the input signals during the sample phase of operation, and connected across the amplifier during the hold phase of operation to provide the sampled input signals.

20. The sample-and-hold amplifier of claim 18, wherein the sample-and-hold amplifier comprises a plurality of switches that are switchable in an order to set the phase of operation of the sample-and-hold amplifier.

* * * * *